United States Patent
Tan et al.

(10) Patent No.: US 9,677,567 B2
(45) Date of Patent: Jun. 13, 2017

(54) METHOD FOR CONTROLLING ROTATION SPEED AND ELECTRONIC DEVICE HAVING A VIBRATING FAN MODULE

(71) Applicant: HTC Corporation, Taoyuan County (TW)

(72) Inventors: Tzu-Chia Tan, Taoyuan County (TW); Chu-Yang Hsu, Taoyuan County (TW)

(73) Assignee: HTC Corporation, Taoyuan (TW)

(*) Notice: Subject to any disclaimer, the term of this patent is extended or adjusted under 35 U.S.C. 154(b) by 205 days.

(21) Appl. No.: 14/153,091

(22) Filed: Jan. 13, 2014

(65) Prior Publication Data

US 2015/0198167 A1    Jul. 16, 2015

(51) Int. Cl.
*G05D 23/00* (2006.01)
*F04D 27/00* (2006.01)
(Continued)

(52) U.S. Cl.
CPC ......... *F04D 27/004* (2013.01); *F04D 19/002* (2013.01); *F04D 27/001* (2013.01); *H05K 7/20209* (2013.01)

(58) Field of Classification Search
CPC .... F04D 27/001; F04D 27/004; F04D 19/002; H05K 7/20209; F28F 13/10
(Continued)

(56) References Cited

U.S. PATENT DOCUMENTS 6,002,927 A * 12/1999 Hayes, Jr. .............. H02K 7/061
                                                           310/50
6,124,692 A * 9/2000 Canada .................. G01R 31/343
                                                           318/490
(Continued)

FOREIGN PATENT DOCUMENTS

CN    101101007    1/2008
CN    101984740    3/2011
(Continued)

OTHER PUBLICATIONS

"Office Action of Taiwan Counterpart Application", issued on Dec. 16, 2015, p. 1-p. 5.
(Continued)

*Primary Examiner* — Len Tran
*Assistant Examiner* — Gordon Jones
(74) *Attorney, Agent, or Firm* — Jianq Chyun IP Office

(57) ABSTRACT

A method for controlling rotation speed is suitable for an electronic device having a vibrating fan module. The vibrating fan module can generate vibration and output airflow simultaneously. The method for controlling rotation speed includes the following steps. Whether a vibration signal transmitted by the electronic device is received is determined. When the vibration signal is received, a rotation speed of the vibrating fan module is adjusted to a vibration rotation speed. A temperature of the electronic device is sensed. Whether the temperature of the electronic device is greater than or equal to a first preset temperature is determined. When the temperature of the electronic device is greater than or equal to the first preset temperature, the rotation speed of the vibrating fan module is adjusted to a first rotation speed according to the temperature of the electronic device. The first rotation speed is less than the vibration rotation speed.

10 Claims, 5 Drawing Sheets

(51) Int. Cl.
*F04D 19/00* (2006.01)
*H05K 7/20* (2006.01)

(58) Field of Classification Search
USPC ............ 165/287, 244, 247, 80.3, 84, 121
See application file for complete search history.

(56) References Cited

U.S. PATENT DOCUMENTS

| | | | |
|---|---|---|---|
| 7,769,417 B2 * | 8/2010 | Tierling | G06F 3/016 345/156 |
| 8,169,402 B2 * | 5/2012 | Shahoian | G06F 3/016 345/156 |
| 8,477,490 B2 * | 7/2013 | Rothkopf | G06F 1/203 361/679.46 |
| 8,542,105 B2 * | 9/2013 | Grant | A63F 13/02 116/205 |
| 9,063,713 B2 * | 6/2015 | Sumpter | G06F 1/206 |
| 2005/0273208 A1 * | 12/2005 | Yazawa | G01K 7/425 700/299 |
| 2007/0297915 A1 * | 12/2007 | Li | F04D 25/0613 416/93 R |
| 2011/0301870 A1 * | 12/2011 | Tam | H02P 25/027 702/34 |
| 2012/0107094 A1 * | 5/2012 | Lillis | F01D 17/06 415/118 |
| 2015/0173241 A1 * | 6/2015 | Hsu | H05K 7/20209 165/287 |

FOREIGN PATENT DOCUMENTS

| | | | | |
|---|---|---|---|---|
| CN | 103423188 | | 12/2013 | |
| JP | GB 2354552 A | * | 3/2001 | ........... F04D 19/002 |
| TW | M272364 | | 8/2005 | |
| TW | I340795 | | 4/2011 | |

OTHER PUBLICATIONS

"Office Action of China Counterpart Application", issued on Jan. 29, 2016, p. 1-p. 6.

"Second Office Action of China Counterpart Application", issued on Oct. 9, 2016, p. 1-p. 8.

* cited by examiner

METHOD FOR CONTROLLING ROTATION SPEED AND ELECTRONIC DEVICE HAVING A VIBRATING FAN MODULE

BACKGROUND

Field of the Invention

The invention relates to a method for controlling rotation speed which is suitable for an electronic device built in with a vibrating fan module, and an electronic device having a vibrating fan module.

Description of Related Art

With the advancement of the technology, smart phones have become mainstreams of consumer electronics products. In addition to existing functions of a traditional cell phone, a smart phone may also install applications to expend other functions such as web browsing and games. However, when being used at a high loading, the smart phone may generate heat to rise a temperature of a housing of the smart phone, resulting discomfort to a user who contacts it. Therefore, a design in heat dissipation of the smart phone has become a crucial key for improving performance of the smart phone.

SUMMARY

The invention provides a method for controlling rotation speed, suitable for controlling a rotation speed of a vibrating fan module built in an electronic device.

The invention also provides an electronic device, built in with a vibrating fan module that is controllable.

The method for controlling rotation speed of the invention is suitable for an electronic device having a vibrating fan module. The vibrating fan module is capable of generating vibration and outputting airflow simultaneously. The method for controlling rotation speed includes the following steps. Whether a vibration signal transmitted by the electronic device is received is determined. When the vibration signal is received, a rotation speed of the vibrating fan module is adjusted to a vibration rotation speed. A temperature of the electronic device is sensed. Whether the temperature of the electronic device is greater than or equal to a first preset temperature is determined. When the temperature of the electronic device is greater than or equal to the first preset temperature, the rotation speed of the vibrating fan module is adjusted to a first rotation speed according to the temperature of the electronic device. The first rotation speed is less than the vibration rotation speed.

The electronic device of the invention includes a housing, a vibrating fan module, a temperature sensor and a control module. The vibrating fan module includes a fan unit, an eccentric unit and a drive unit. The fan unit is capable of generating airflow through rotation thereby cooling a heat generation element. The eccentric unit is structurally coupled to the fan unit, and capable of generating vibration through rotation of the fan unit. The drive unit is electrically coupled to the fan unit, and capable of driving the fan unit to rotate. The temperature sensor is disposed in the housing, and capable of sensing a temperature in the housing. The control module is disposed in the housing, coupled to the vibrating fan module and the temperature sensor, and capable of adjusting a rotation speed of the vibrating fan module according to a temperature signal transmitted by the temperature sensor and a vibration signal.

Based on above, according to the method for controlling rotation speed of the invention, when a vibration signal is received, the rotation speed of the vibrating fan module may be adjusted to the vibration rotation speed, so as to provide a reminder function through vibration. Further, the electronic device may be cooled by adjusting the rotation speed of the vibrating fan module according to the temperature of the electronic device being sensed. Furthermore, the message indicating that the vibrating fan module is operating may be displayed by the output module of the electronic device, so as to remind the user that there will be some sense of vibration. In addition, the invention also provides the electronic device having the vibrating fan module, built in with the vibrating fan module that is controllable.

To make the above features and advantages of the disclosure more comprehensible, several embodiments accompanied with drawings are described in detail as follows.

DESCRIPTION OF THE EMBODIMENTS

Figure 1:
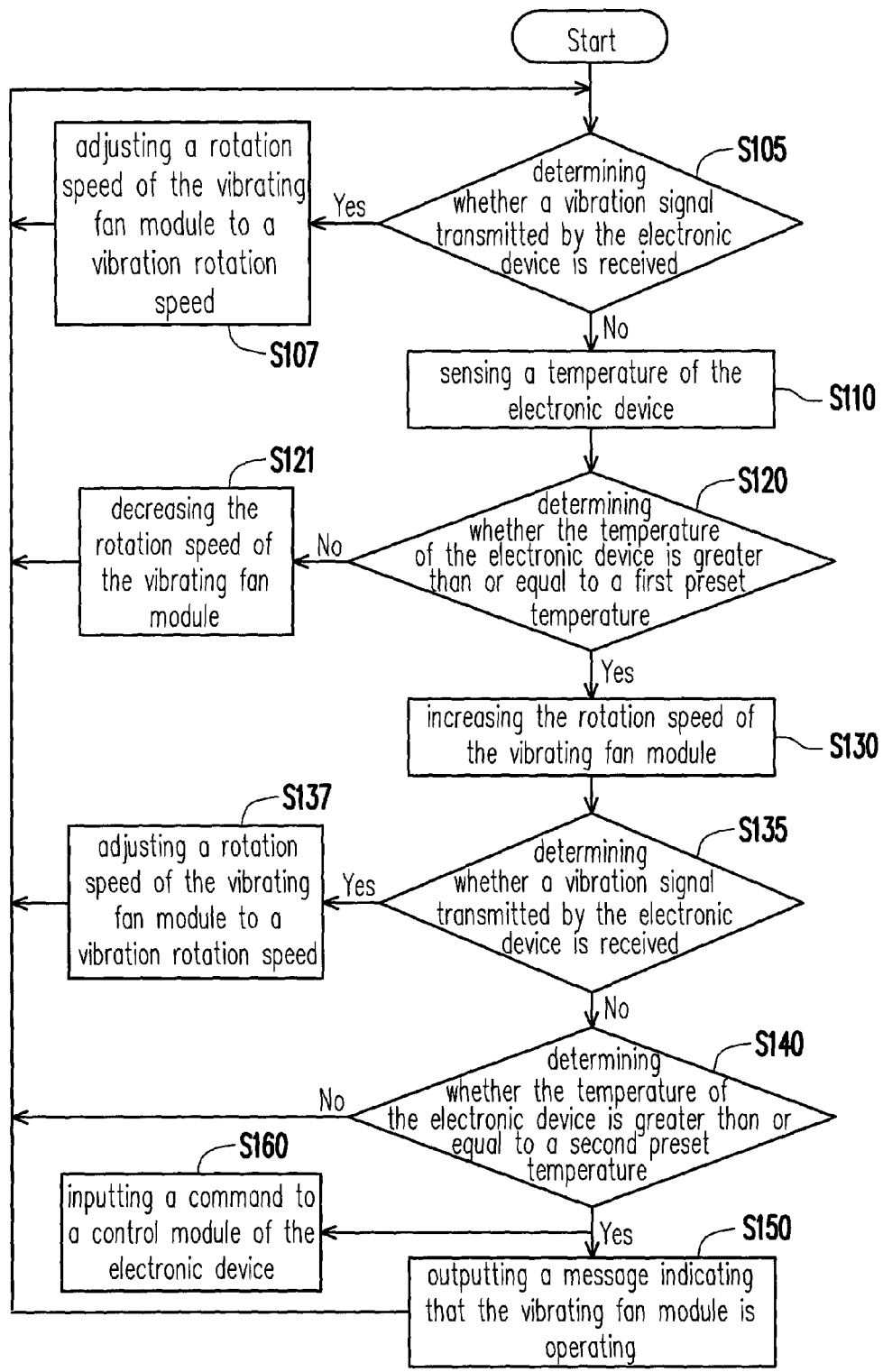
FIG. 1 is a flowchart of a method for controlling rotation speed according to an embodiment of the invention.

FIG. 1 is a flowchart of a method for controlling rotation speed according to an embodiment of the invention. Referring to FIG. 1, the method for controlling rotation speed of the present embodiment is suitable for an electronic device having a vibrating fan module. The electronic device is a smart phone or a tablet computer for example. The vibrating fan module includes a miniature fan (i.e., a fan unit) having a swing head (i.e., an eccentric unit) added on a blade revolving shaft, such that vibration may be generated and airflow may be outputted simultaneously during operation. Therefore, when it is required to vibrate the electronic device, the vibrating fan module is capable of generating vibration. Furthermore, when it is required to cool the electronic device, the vibrating fan module is capable of outputting airflow. In addition, the vibrating fan module may further include a drive unit which is coupled to a control module of the electronic device, so as to drive above-said miniature fan.

Referring to FIG. 1, in step S100, whether a vibration signal transmitted by the electronic device is received is determined. For example, the vibration signal is a vibration signal of an incoming call, or a vibration signal generated by other applications (e.g., game software). When the vibration signal is received, proceeding to step S105 in which a rotation speed of the vibrating fan module is adjusted to a vibration rotation speed.

Referring to FIG. 1, in case the vibration signal is not received in step S100, proceeding to step S110 in which a temperature of the electronic device is sensed. In the present embodiment, the temperature of the electronic device being sensed may be represented by a battery temperature of the electronic device sensed by a temperature sensor of the electronic device.

Referring to FIG. 1, proceeding to step S120 in which whether the temperature of the electronic device is greater than or equal to a first preset temperature is determined. When the temperature of the electronic device is greater than or equal to the first preset temperature, proceeding to step S130 in which the rotation speed of the vibrating fan module is increased to a first rotation speed according to the temperature of the electronic device. For instance, the first preset temperature is 37° C. Accordingly, when the temperature of the electronic device is greater than or equal to 37° C., the rotation speed of the vibrating fan module is increased according to the temperature of the electronic device. Furthermore, when the temperature of the electronic device is not greater than or equal to the first preset temperature, proceeding to step S121 in which the rotation speed of the vibrating fan module is decreased according to the temperature of the electronic device.

In the present embodiment, the step of increasing the rotation speed of the vibrating fan module (S130) may include the following sub-steps. A target rotation speed is obtained through multiplying a current temperature of the electronic device minus a threshold temperature by a rotation speed per unit, and then the rotation speed of the vibrating fan module is adjusted from a current rotation speed to the target rotation speed. Said current rotation speed may include zero which indicates that the vibrating fan module is in a non-operational state.

For example, the target rotation speed (1000 RPM) is obtained through multiplying the current temperature (37° C.) of the electronic device minus the threshold temperature (36° C.) by the rotation speed per unit (1000 RPM per ° C.), and then the rotation speed of the vibrating fan module is adjusted from the current rotation speed (0 RPM) to the target rotation speed (1000 RPM).

As another example, the target rotation speed (3000 RPM) is obtained through multiplying the current temperature (39° C.) of the electronic device minus the threshold temperature (36° C.) by the rotation speed per unit (1000 RPM per ° C.), and then the rotation speed of the vibrating fan module is adjusted from the current rotation speed (0 RPM) to the target rotation speed (3000 RPM).

Referring to FIG. 1, proceeding to step S140 in which whether the temperature of the electronic device is greater than or equal to a second preset temperature is determined, and the second preset temperature is greater than the first preset temperature. Accordingly, when the temperature of the electronic device is greater than or equal to the second preset temperature, proceeding to step S150 in which a message indicating that the vibrating fan module is operating is outputted from an output module of the electronic device, so as to remind the user that there will be some sense of vibration. Thereafter, returning to step S110. In the present embodiment, the input module may be a display screen of the electronic device. In addition, when the temperature of the electronic device is not greater than or equal to the second preset temperature, returning to step S110.

For instance, the second preset temperature is 40° C. Accordingly, when the temperature of the electronic device is greater than or equal to 40° C., proceeding to step S150 in which the message indicating that the vibrating fan module is operating is outputted from the output module of the electronic device, so as to remind the user that there will be some sense of vibration.

Furthermore, when the temperature of the electronic device is greater than or equal to the second preset temperature, proceeding to step S160 in which a command is inputted to the control module of the electronic device from the input module of the electronic device, so as to decide whether to turn off the vibrating fan module coupled to the control module. In the present embodiment, the input module may be a touch screen or buttons of the electronic device.

Figure 2:
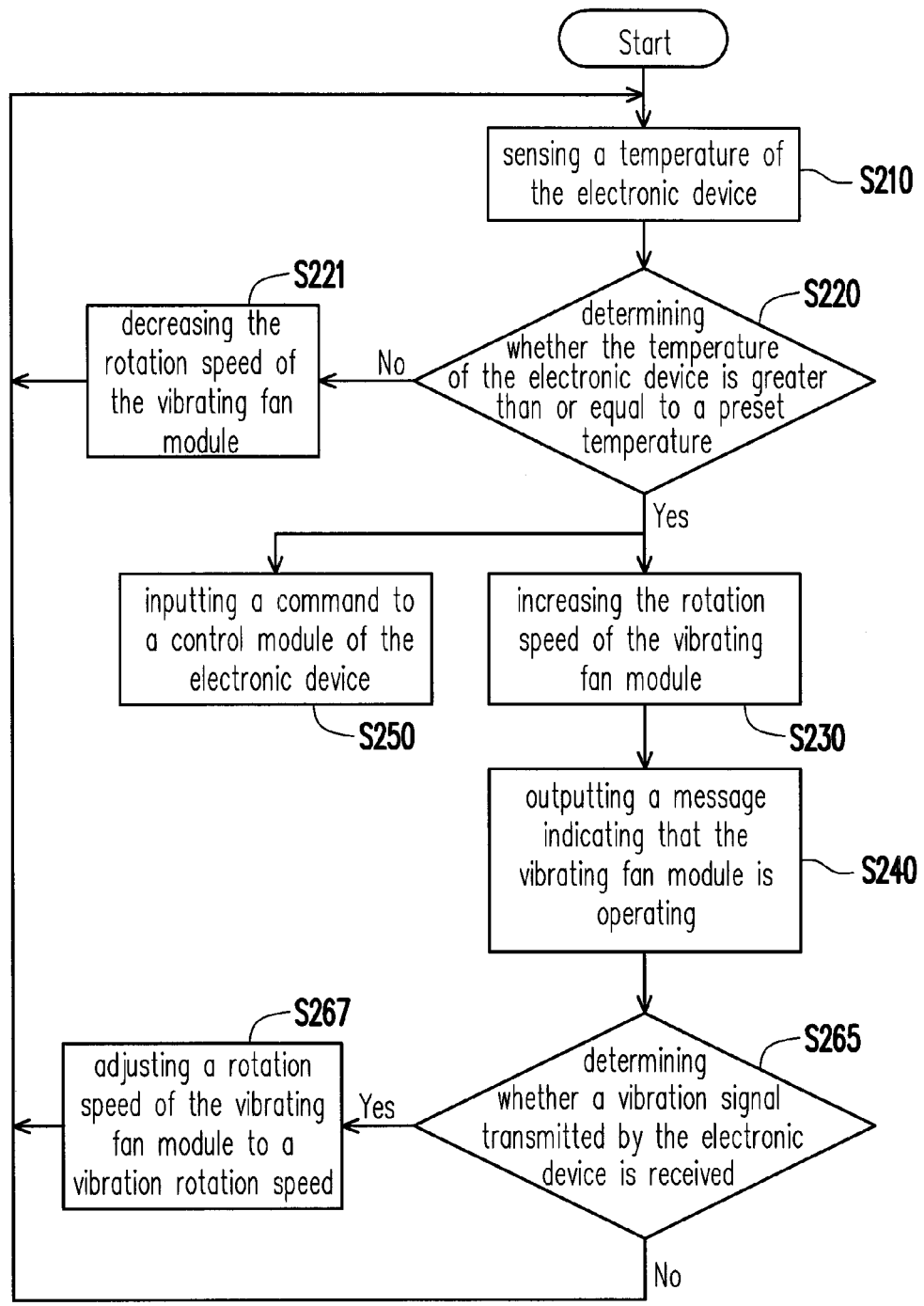
FIG. 2 is a flowchart of a method for controlling rotation speed according to another embodiment of the invention.

FIG. 2 is a flowchart of a method for controlling rotation speed according to another embodiment of the invention. Referring to FIG. 2, the method for controlling rotation speed of the present embodiment is suitable for an electronic device having a vibrating fan module. The electronic device is a smart phone or a tablet computer for example. The vibrating fan module includes a miniature fan having a swing head added on a blade revolving shaft, such that vibration may be generated and airflow may be outputted simultaneously during operation. Therefore, when it is required to vibrate the electronic device, the vibrating fan module is capable of generating vibration. Furthermore, when it is required to cool the electronic device, the vibrating fan module is capable of outputting airflow. In addition, the vibrating fan module may further include a drive unit which is coupled to a control module of the electronic device, so as to drive above-said miniature fan.

Referring to FIG. 2, in step S210, a temperature of the electronic device is sensed. In the present embodiment, the temperature of the electronic device being sensed may be represented by a battery temperature of the electronic device sensed by a temperature sensor of the electronic device.

Referring to FIG. 2, proceeding to step S220 in which whether the temperature of the electronic device is greater than or equal to a preset temperature is determined. When the temperature of the electronic device is greater than or equal to the preset temperature, proceeding to step S230 in which the rotation speed of the vibrating fan module is increased according to the temperature of the electronic device. For instance, the preset temperature is 37° C. Accordingly, when the temperature of the electronic device is greater than or equal to 37° C., the rotation speed of the vibrating fan module is increased according to the temperature of the electronic device. Furthermore, when the temperature of the electronic device is not greater than or equal to the preset temperature, proceeding to step S221 in which the rotation speed of the vibrating fan module is decreased according to the temperature of the electronic device.

In the present embodiment, the step of adjusting the rotation speed of the vibrating fan module (S230) may include the following sub-steps. A target rotation speed is obtained through multiplying a current temperature of the electronic device minus a threshold temperature by a rotation speed per unit, and then the rotation speed of the vibrating fan module is increased from a current rotation speed to the target rotation speed. Said current rotation speed may include zero which indicates that the vibrating fan module is in a non-operational state.

For example, the target rotation speed (1000 RPM) is obtained through multiplying the current temperature (37° C.) of the electronic device minus a threshold temperature (36° C.) by a rotation speed per unit (1000 RPM per ° C.), and then the rotation speed of the vibrating fan module is increased from a current rotation speed (0 RPM) to the target rotation speed (1000 RPM).

As another example, the target rotation speed (3000 RPM) is obtained through multiplying the current temperature (39° C.) of the electronic device minus the threshold temperature (36° C.) by the rotation speed per unit (1000 RPM per ° C.), and then the rotation speed of the vibrating fan module is increased from the current rotation speed (0 RPM) to the target rotation speed (3000 RPM).

Referring to FIG. 2, proceeding to step S240 in which a message indicating that the vibrating fan module is operating is outputted from an output module of the electronic device, so as to remind the user that there will be some sense of vibration. In the present embodiment, the input module may be a display screen of the electronic device.

Referring to FIG. 2, proceeding to step S265 in which whether a vibration signal transmitted by the electronic device is received is determined. For example, the vibration signal is a vibration signal of an incoming call, or a vibration signal generated by other applications (e.g., game software). When the vibration signal is received, proceeding to step S267 in which a rotation speed of the vibrating fan module is adjusted to a vibration rotation speed. Returning to step S210 when the vibration signal is not received.

Furthermore, when the temperature of the electronic device is greater than or equal to the preset temperature, proceeding to step S250 in which a command is inputted to a control module of the electronic device from an input module of the electronic device, so as to decide whether to turn off the vibrating fan module coupled to the control module. In the present embodiment, the input module may be a touch screen or buttons of the electronic device.

Figure 3:
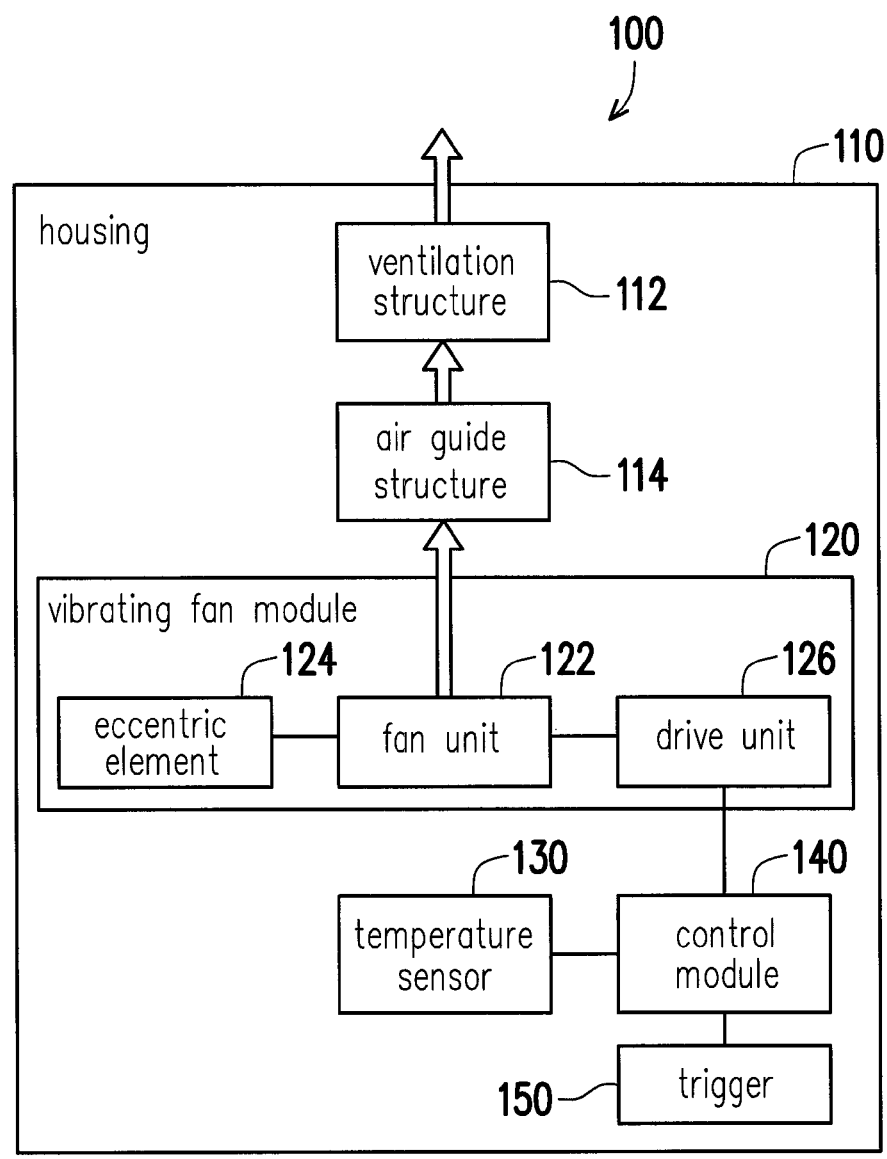
FIG. 3 is a block diagram of an electronic device according to another embodiment of the invention.

FIG. 3 is a block diagram of an electronic device according to another embodiment of the invention. Referring to FIG. 3, an electronic device 100 of the present embodiment includes a housing 110, a vibrating fan module 120, a temperature sensor 130 and a control module 140. The vibrating fan module 120 includes a fan unit 122, an eccentric unit 124 and a drive unit 126. The fan unit 122 is capable of generating airflow through rotation thereby cooling an interior of the housing 110. The eccentric unit 124 is structurally coupled to the fan unit 122, and capable of generating vibration through rotation of the fan unit 122. The drive unit 126 is coupled to the fan unit 122, and capable of driving the fan unit 122 to rotate. The temperature sensor 130 is disposed in the housing 110, and capable of sensing a temperature in the housing 110. The control module 140 is disposed in the housing 110, coupled to the vibrating fan module 120 and the temperature sensor 130, and capable of adjusting a rotation speed of the vibrating fan module 120 according to a temperature signal transmitted by the temperature sensor 130. In the present embodiment, the electronic device 100 of the present embodiment includes a trigger 150 capable of being triggered for generating the vibration signal to be transmitted to the control module 140.

Figure 4:
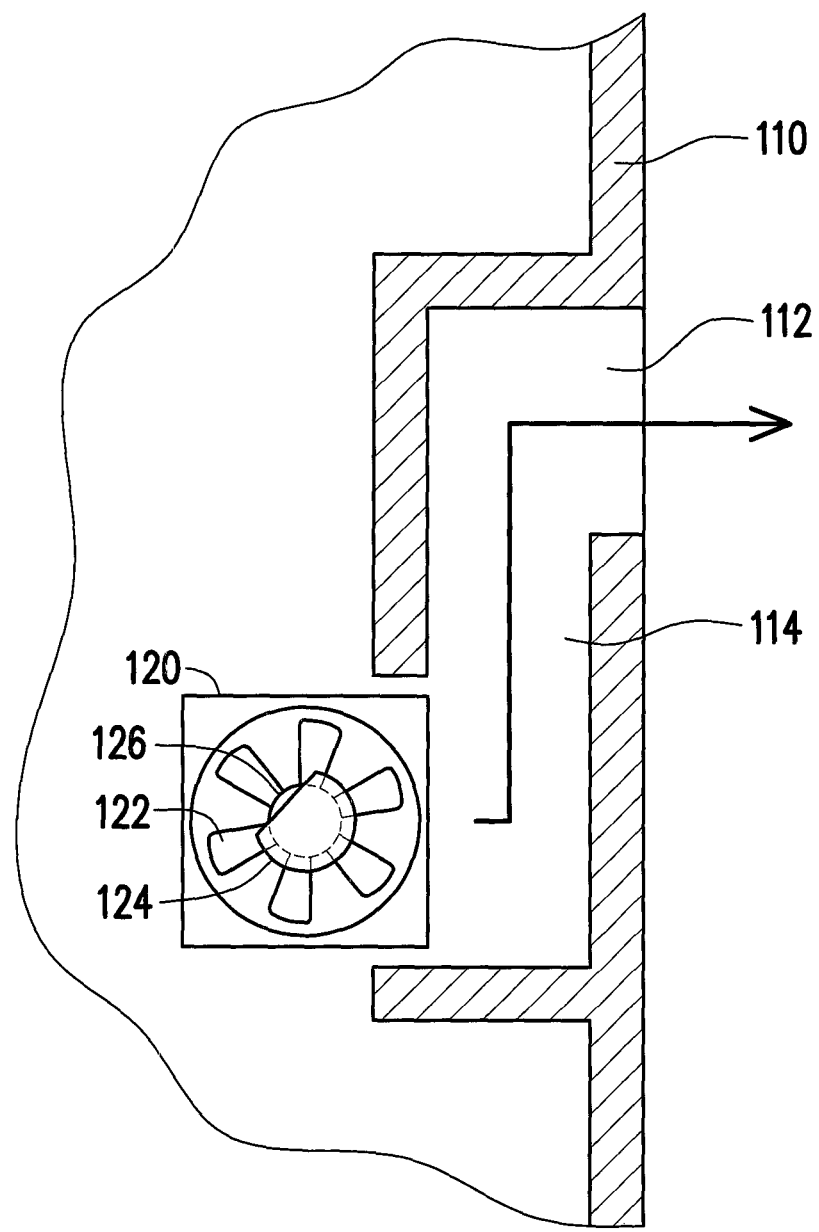
FIG. 4 is a schematic diagram of a local structure of the electronic device depicted in FIG. 3.
Figure 5:
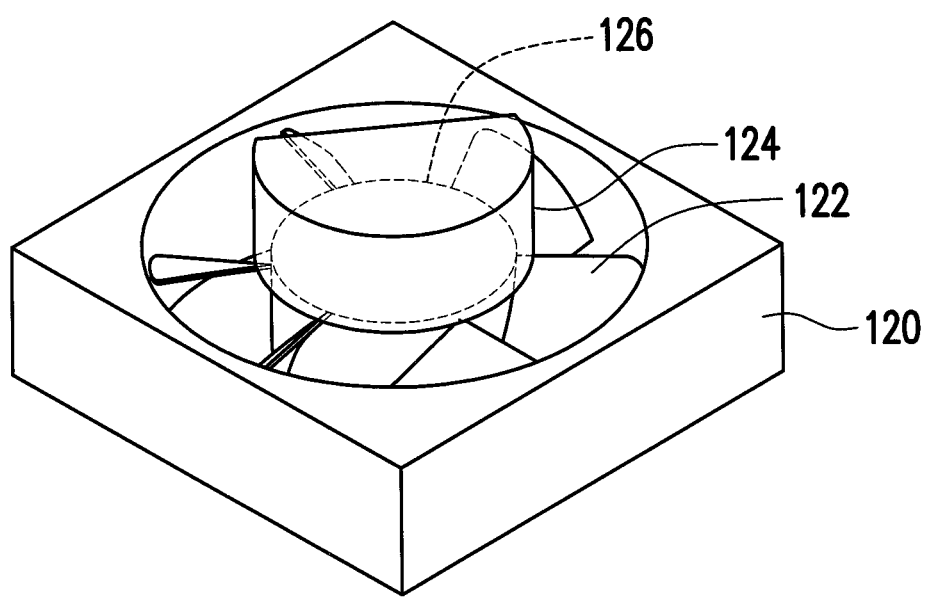
FIG. 5 is a 3D diagram of the vibrating fan module depicted in FIG. 4.

In addition, FIG. 4 is a schematic diagram of a local structure of the electronic device depicted in FIG. 3, and FIG. 5 is a 3D diagram of the vibrating fan module depicted in FIG. 4. Referring to FIG. 4 and FIG. 5, the housing 110 further has a vent structure 112 (e.g., vent apertures), and the vent structure 112 is configured to exhaust airflow generated by the fan unit 122 from the housing 110. In addition, the housing 110 further has an air-duct structure 114 (e.g., air-duct channels), and the air-duct structure 114 is configured to circulate airflow generated by the fan unit 122 in the housing 110.

In summary, according to the method for controlling rotation speed of the invention, the rotation speed of the vibrating fan module may be adjusted to the vibration rotation speed, so as to provide a reminder function through vibration. Further, the electronic device may be cooled by adjusting the rotation speed of the vibrating fan module according to the temperature of the electronic device being sensed. Furthermore, the message indicating that the vibrating fan module is operating may be displayed by the output module of the electronic device, so as to remind the user that there will be some sense of vibration. Moreover, the vibrating fan module may be turned off by the command inputted from the input module of the electronic device. In addition, the invention also provides the electronic device having the vibrating fan module, built in with the vibrating fan module that is controllable.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A method for controlling rotation speed, suitable for an electronic device having a vibrating fan module, the vibrating fan module being capable of generating vibration and outputting airflow simultaneously, and the method for controlling rotation speed comprising:
   determining whether a vibration signal transmitted by the electronic device is received, and adjusting a rotation speed of the vibrating fan module to a vibration rotation speed when the vibration signal is received;
   sensing a temperature of the electronic device;
   determining whether the temperature of the electronic device is greater than or equal to a first preset temperature, and adjusting the rotation speed of the vibrating fan module to a first rotation speed according to the temperature of the electronic device when the temperature of the electronic device is greater than or equal to the first preset temperature, wherein the first rotation speed is less than the vibration rotation speed; and
   determining whether the temperature of the electronic device is greater than a second preset temperature, the second preset temperature being greater than the first preset temperature, and outputting a message indicating that the vibrating fan module has started to operate and notifying a user the generation of a sense of vibration from an output module of the electronic device when the temperature of the electronic device is greater than the second preset temperature.

2. The method for controlling rotation speed of claim 1, wherein the step of adjusting the rotation speed of the vibrating fan module according to the temperature of the electronic device comprises:
   obtaining a target rotation speed through multiplying a current temperature of the electronic device minus a threshold temperature by a rotating speed per unit; and
   adjusting the rotation speed of the vibrating fan module from a current rotation speed to the target rotation speed.

3. The method for controlling rotation speed of claim 2, wherein the current rotation speed comprises zero.

4. The method for controlling rotation speed of claim 1, wherein in the step of determining whether the temperature of the electronic device is greater than the second preset temperature, when the temperature of the electronic device is greater than the second preset temperature, a command to a control module of the electronic device is inputted from an input module of the electronic device, so as to decide whether to turn off the vibrating fan module coupled to the control module.

5. The method for controlling rotation speed of claim 1, further comprising:
   inputting a command to a control module of the electronic device from an input module of the electronic device, so as to decide whether to turn off the vibrating fan module coupled to the control module.

6. A method for controlling rotation speed, suitable for an electronic device having a vibrating fan module, the vibrating fan module being capable of generating vibration and outputting airflow simultaneously, and the method for controlling rotation speed comprising:

sensing a temperature of the electronic device;

determining whether the temperature of the electronic device is greater than or equal to a first preset temperature, and adjusting a rotation speed of the vibrating fan module to a first rotation speed according to the temperature of the electronic device when the temperature of the electronic device is greater than or equal to the first preset temperature;

determining whether a vibration signal transmitted by the electronic device is received, stopping sensing the temperature of the electronic device and adjusting the rotation speed of the vibrating fan module to a vibration rotation speed when the vibration signal is received, wherein the first rotation speed is less than the vibration rotation speed; and determining whether the temperature of the electronic device is greater than a second preset temperature, the second preset temperature being greater than the first preset temperature, and outputting a message indicating that the vibrating fan module has started to operate and notifying a user the generation of a sense of vibration from an output module of the electronic device when the temperature of the electronic device is greater than the second preset temperature.

7. The method for controlling rotation speed of claim 6, wherein the step of adjusting the rotation speed of the vibrating fan module according to the temperature of the electronic device comprises:

obtaining a target rotation speed through multiplying a current temperature of the electronic device minus a threshold temperature by a rotation speed per unit; and adjusting the rotation speed of the vibrating fan module from a current rotation speed to the target rotation speed.

8. The method for controlling rotation speed of claim 7, wherein the current rotation speed comprises zero.

9. The method for controlling rotation speed of claim 6, wherein in the step of determining whether the temperature of the electronic device is greater than the second preset temperature, when the temperature of the electronic device is greater than the second preset temperature, a command to a control module of the electronic device is inputted from an input module of the electronic device, so as to decide whether to turn off the vibrating fan module coupled to the control module.

10. The method for controlling rotation speed of claim 6, further comprising:

inputting a command to a control module of the electronic device from an input module of the electronic device, so as to decide whether to turn off the vibrating fan module coupled to the control module.

* * * * *